US00RE49725E

(19) United States
(12) Reissued Patent
De Jong et al.

(10) Patent Number: US RE49,725 E
(45) Date of Reissued Patent: *Nov. 14, 2023

(54) METHOD AND ARRANGEMENT FOR HANDLING AND PROCESSING SUBSTRATES

(71) Applicant: ASML Netherlands B.V., Veldhoven (NL)

(72) Inventors: Hendrik Jan De Jong, The Hague (NL); Marco Jan-Jaco Wieland, Delft (NL)

(73) Assignee: ASML Netherlands B.V., Veldhoven (NL)

( * ) Notice: This patent is subject to a terminal disclaimer.

(21) Appl. No.: 17/025,997

(22) Filed: Sep. 18, 2020

Related U.S. Patent Documents

Reissue of:
(64) Patent No.: 10,078,274
Issued: Sep. 18, 2018
Appl. No.: 15/250,977
Filed: Aug. 30, 2016

U.S. Applications:
(63) Continuation of application No. 12/708,543, filed on Feb. 19, 2010, now Pat. No. 9,460,954.
(Continued)

(30) Foreign Application Priority Data

Apr. 3, 2009 (GB) ..... 0905786

(51) Int. Cl.
*G03F 7/20* (2006.01)
*H01L 21/687* (2006.01)
(Continued)

(52) U.S. Cl.
CPC ..... *G03F 7/707* (2013.01); *H01L 21/6776* (2013.01); *H01L 21/67173* (2013.01);
(Continued)

(58) Field of Classification Search
CPC ..... G03F 7/7075; H01L 21/677; H01L 21/67706; H01L 21/67724;
(Continued)

(56) References Cited

U.S. PATENT DOCUMENTS 4,475,223 A 10/1984 Taniguchi et al.
4,951,601 A 8/1990 Maydan et al.
(Continued)

FOREIGN PATENT DOCUMENTS

CN 1957443 A 5/2007
CN 101174101 A 5/2008
(Continued)

OTHER PUBLICATIONS

The extended European Search Report issued by the European Patent Office dated Sep. 24, 2019 corresponding with European Application No. 19 169 075.9. (5 pages).

*Primary Examiner* — James A Menefee
(74) *Attorney, Agent, or Firm* — Finnegan, Henderson Farabow, Garrett & Dunner, LLP

(57) ABSTRACT

The invention relates to a substrate handling and exposure arrangement comprising a plurality of lithography apparatus, a clamp preparation unit for clamping a wafer on a wafer support structure, a wafer track, wherein the clamp preparation unit is configured for accepting a wafer from the wafer track, and an additional wafer track for transferring the clamp towards the plurality of lithography apparatus.

18 Claims, 8 Drawing Sheets

Related U.S. Application Data

(60) Provisional application No. 61/154,411, filed on Feb. 22, 2009.

(51) Int. Cl.
*H01L 21/683* (2006.01)
*G03F 7/00* (2006.01)
*H01L 21/67* (2006.01)
*H01L 21/677* (2006.01)

(52) U.S. Cl.
CPC .. *H01L 21/67706* (2013.01); *H01L 21/67724* (2013.01); *H01L 21/67748* (2013.01); *H01L 21/67778* (2013.01); *H01L 21/683* (2013.01); *H01L 21/687* (2013.01); *H01L 21/6838* (2013.01); *H01L 21/6875* (2013.01); *H01L 21/68707* (2013.01); *H01L 21/68742* (2013.01); *H01L 21/68785* (2013.01); *Y10T 29/49815* (2015.01); *Y10T 29/49998* (2015.01); *Y10T 29/53* (2015.01)

(58) Field of Classification Search
CPC ..... H01L 21/67739; H01L 21/67748; H01L 21/6776; H01L 21/67778; H01L 21/683
See application file for complete search history.

(56) References Cited

U.S. PATENT DOCUMENTS

| | | | | |
|---|---|---|---|---|
| 5,536,128 | A | 7/1996 | Shimoyashiro et al. | |
| 5,677,109 | A | 10/1997 | Morikawa et al. | |
| 5,914,493 | A | 6/1999 | Morita et al. | |
| 6,045,433 | A | 4/2000 | Dvir et al. | |
| 6,174,366 | B1 | 1/2001 | Ihantola | |
| 6,359,678 | B1 | 3/2002 | Ota et al. | |
| 6,734,117 | B2 * | 5/2004 | Sogard | G03F 7/707 361/234 |
| 7,158,211 | B2 | 1/2007 | Straaijer | |
| 8,436,324 | B2 | 5/2013 | De Jong et al. | |
| 9,117,631 | B2 * | 8/2015 | De Jong | H01L 21/00 |
| 9,460,954 | B2 * | 10/2016 | De Jong | H01L 21/67748 |
| 10,078,274 | B2 | 9/2018 | De Jong et al. | |
| 2002/0034886 | A1 | 3/2002 | Kurita et al. | |
| 2002/0050244 | A1 | 5/2002 | Engesser | |
| 2002/0067585 | A1 | 6/2002 | Fujiwara | |
| 2003/0073309 | A1 | 4/2003 | Emami | |
| 2003/0108818 | A1 | 6/2003 | Livesay et al. | |
| 2004/0217302 | A1 | 11/2004 | Shin et al. | |
| 2004/0247417 | A1 | 12/2004 | Fujimura et al. | |
| 2005/0054217 | A1 * | 3/2005 | Klomp | G03F 7/70975 438/795 |
| 2005/0259236 | A1 | 11/2005 | Straaijer et al. | |
| 2006/0045668 | A1 * | 3/2006 | Grabowski | H01L 21/67126 414/217 |
| 2006/0077367 | A1 | 4/2006 | Naoyuki et al. | |
| 2007/0114440 | A1 | 5/2007 | Yang et al. | |
| 2008/0024743 | A1 | 1/2008 | Kruit et al. | |
| 2008/0068580 | A1 | 3/2008 | Mori et al. | |
| 2008/0106715 | A1 | 5/2008 | Lin et al. | |
| 2008/0165330 | A1 | 7/2008 | Takeyuki | |
| 2008/0225261 | A1 | 9/2008 | Hirayanagi | |
| 2008/0286491 | A1 | 11/2008 | Takahashi et al. | |
| 2008/0286947 | A1 | 11/2008 | Coenen et al. | |
| 2008/0309909 | A1 | 12/2008 | Yamamoto | |
| 2009/0027649 | A1 | 1/2009 | De Boer et al. | |
| 2010/0238421 | A1 | 9/2010 | De Jong et al. | |
| 2010/0265486 | A1 | 10/2010 | De Jong et al. | |

FOREIGN PATENT DOCUMENTS

| | | | |
|---|---|---|---|
| EP | 1109203 | A2 | 6/2001 |
| EP | 1843386 | A1 | 10/2007 |
| EP | 1860684 | A1 | 11/2007 |
| JP | 59-174286 | A | 10/1984 |
| JP | 60-043841 | A | 3/1985 |
| JP | 07-029787 | A | 1/1995 |
| JP | 07-282993 | A | 10/1995 |
| JP | 2001/291688 | A2 | 10/2001 |
| JP | 2001/332487 | A | 11/2001 |
| JP | 2006/066690 | A | 3/2006 |
| JP | 2006/310483 | A2 | 9/2006 |
| JP | 2007/059929 | A | 3/2007 |
| KR | 10-2004/0094171 | | 11/2004 |
| WO | WO 87/04416 | A1 | 7/1987 |
| WO | WO 1996/020583 | A1 | 7/1996 |
| WO | WO 2002/023597 | A2 | 3/2002 |
| WO | WO 2004/021411 | A2 | 3/2004 |
| WO | WO 2005/113853 | | 12/2005 |
| WO | WO 2006/077859 | A1 | 7/2006 |
| WO | WO 2009/011574 | A1 | 1/2009 |
| WO | WO 2010/094748 | A1 | 8/2010 |
| WO | WO 2010/094800 | A1 | 8/2010 |

* cited by examiner

METHOD AND ARRANGEMENT FOR HANDLING AND PROCESSING SUBSTRATES

Matter enclosed in heavy brackets [ ] appears in the original patent but forms no part of this reissue specification; matter printed in italics indicates the additions made by reissue; a claim printed with strikethrough indicates that the claim was canceled, disclaimed, or held invalid by a prior post-patent action or proceeding.

CROSS REFERENCE TO RELATED APPLICATIONS

This application is *a reissue of U.S. application Ser. No. 15/250,977 filed on Aug. 30, 2016, now U.S. Pat. No. 10,078,274, which is* a continuation of U.S. application Ser. No. 12/708,543 filed on Feb. 19, 2010, now U.S. Pat. No. 9,460,954, which claims priority to U.S. provisional application No. 61/154,411 filed on Feb. 22, 2009, and British application no. GB 0905786.0 filed on Apr. 3, 2009. All applications are hereby incorporated by reference in their entirety.

BACKGROUND OF THE INVENTION

1. Field of the Invention

The present invention relates to a method of clamping a substrate on a surface of a substrate support structure, a clamp preparation unit configured to clamp a substrate to a substrate support structure, and a lithography system comprising such a clamp preparation unit.

2. Description of the Related Art

Clamping of a substrate, for example a wafer, onto a surface of a substrate support structure, for example a wafer table, is well known in the semiconductor industry, and in particular in lithography systems. In such lithography systems, the clamped substrate is to be patterned by means of subjection to incident photons or charged particles like ions and/or electrons. The clamping ensures the realization of high precision patterning of a target portion of the substrate surface. Preferably, position control by using clamping is not only used during exposure, but also during handling of the substrate, for example during insertion into and/or removal from the exposure chamber within the lithographic system.

Clamping may be achieved by sucking away air between the substrate and the substrate support structure, i.e. by creating a vacuum in between. However, if aforementioned position control is required in a vacuum environment, such a clamping mechanism will not be effective. Various solutions exist for clamping a substrate in a vacuum environment, for example by means of electromechanical clamping. It will be understood that such a solution is not very suitable for use in combination with one or more beams of charged particles like electrons and/or ions.

International application WO2009/011574 filed by the Applicant, describes a lithography system with a substrate support structure for clamping a substrate by means of a layer of stationary liquid, hereafter referred to as capillary layer. The thickness of the capillary layer is such that between the substrate surface and the surface of the substrate support structure a pressure drop arises. As explained in WO2009/011574, adhesion of the liquid to the surfaces of the substrate on the one hand and the substrate support structure on the other hand causes a circumferentially extending liquid surface, concavely extending between the two surfaces. The so-formed concave liquid surface tends to maintain its shape, even if forces are applied to remove the substrate from the substrate support structure surface.

Under some special circumstances, the substrate clamping mechanism described in WO2009/011574 does not perform in an optimal manner, e.g. due to the presence of voids in the capillary layer. Furthermore, due to evaporation processes, the capillary layer will be present for a limited period of time. As a result, the clamping mechanism may only be useful for a selection of devices to be patterned.

BRIEF SUMMARY OF THE INVENTION

It is an object of the invention to provide a substrate support structure for clamping a substrate on a surface thereof by means of a capillary layer as well as a method of clamping a substrate on a surface of a substrate support structure with improved performance. This object has been achieved by providing a method of clamping a substrate on a surface of a substrate support structure, the method comprising applying a liquid on a surface of the substrate support structure, the surface being provided with a plurality of contact elements, so that the liquid forms a layer covering the contact elements; providing the substrate and placing the substrate onto the liquid layer; and removing a portion of the liquid from under the substrate so that the substrate rests on the plurality of contact elements and is clamped by means of a capillary clamping force exerted by a capillary layer of the liquid between the substrate and the surface of the substrate support structure.

According to another aspect of the invention, a clamp preparation unit for clamping a substrate comprises: a substrate support structure having a surface provided with a plurality of contact elements; a liquid dispensing unit for applying a liquid on to the surface of the substrate support structure, so that the contact elements are covered by a liquid layer; a substrate transfer unit for placing the substrate on to the liquid layer; and a liquid removal system for removing a portion of the liquid from under the substrate so that the substrate rests on the plurality of contact elements and is clamped by means of a capillary clamping force exerted by a capillary layer of the liquid between the substrate and the surface of the substrate support structure.

According to yet another aspect of the invention, a method of unclamping a substrate from a substrate support structure is provided, where the substrate is clamped by means of a capillary clamping force exerted by a capillary layer of liquid between the substrate and a surface of the substrate support structure. The method comprises: providing additional liquid to the capillary layer at an outer circumferential surface of the capillary layer; and lifting the substrate from the liquid.

According to yet another aspect of the invention, an unclamping unit comprises: a substrate support structure having a substrate clamped on a surface of the substrate support structure by means of a capillary layer; a liquid removal system for providing additional liquid to the capillary layer under the substrate at an outer circumferential surface of the capillary layer; and a substrate transfer unit for removing the substrate from the liquid layer.

According to yet another aspect of the invention, a lithography system including a lithographic apparatus comprises: a radiation system to provide a patterned beam of radiation; an optical system to project the patterned beam of radiation onto a target portion of a substrate; and a clamp preparation unit for clamping the substrate to a surface of a substrate support structure. The lithography system may also include an unclamping unit.

It will be evident that the presently invented principle may be set into practice in various manners.

BRIEF DESCRIPTION OF THE DRAWINGS

Various aspects of the invention will be further explained with reference to embodiments shown in the drawings wherein.

In the figures, corresponding structural features, i.e. at least functionally, are referred to by identical reference numbers.

DESCRIPTION OF ILLUSTRATIVE EMBODIMENTS

The following is a description of various embodiments of the invention, given by way of example only and with reference to the drawings.

Figure 1:
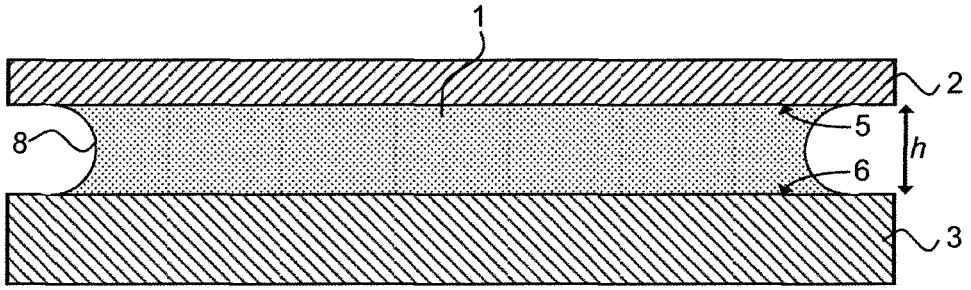
FIG. 1 is a sectional view schematically illustrating a capillary layer between two structures.

FIG. 1 is a sectional view schematically illustrating a capillary liquid layer 1 of a capillary liquid, e.g. water, between a first substrate 2, e.g. a wafer, and a second substrate 3, e.g. a substrate support structure like a wafer table. The first and second substrates 2, 3 have a substantially flat surface 5, 6 respectively. The nominal distance between the opposing surfaces 5, 6 of the first and second substrates 2, 3 is given by height h. The capillary liquid layer 1 has an outer liquid surface 8, which is generally concavely shaped due to adhesive connection of the liquid to the first substrate 2 and the second substrate 3.

The concave liquid surface 8 tends to maintain its shape if the first substrate 2 and the second substrate 3 are subject to forces in a direction substantially perpendicular to the opposing surfaces 5, 6. The concaveness of the outer liquid surface 8 depends on the contact angle between the capillary layer 1 and the surface 5 of the first substrate 2, and on the contact angle between the capillary layer 1 and the surface 6 of the second substrate 3. The respective contact angles depend on the liquid used in the capillary layer 1 as well as on the material properties of the two substrates 2, 3. More details with respect to a capillary layer holding together two structures with substantially flat opposing surface is provided in international patent application WO2009/011574, which is incorporated herein in its entirety.

Figure 2:
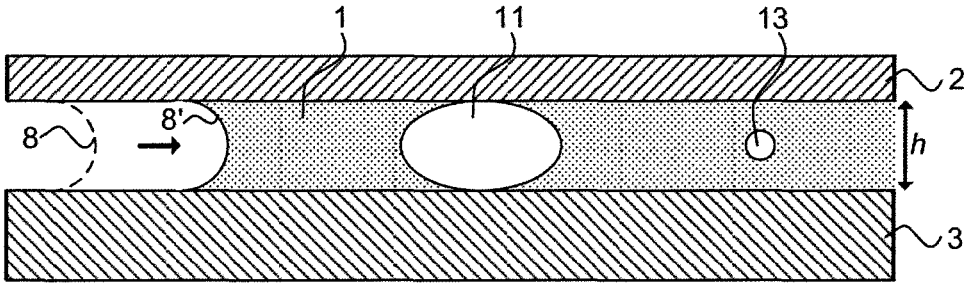
FIG. 2 is a sectional view schematically illustrating processes with a negative impact on the clamp stability of the capillary layer of FIG. 1.

FIG. 2 is a sectional view schematically illustrating processes with a negative impact on the stability of the clamping action performed by means of the capillary liquid layer 1 of FIG. 1. Hereafter, the expression "clamp" will be used for the arrangement where the substrate 2 is clamped to the substrate support structure 3 by means of the capillary layer 1.

If pre-existing bubbles are present in the liquid, introduction of the clamp into a vacuum environment will lead to expansion of such bubbles within the capillary layer. The size of initially small bubbles can grow by several orders of magnitude if ambient pressure decreases, e.g. from 1 bar to $10^{-6}$ mbar. As can be readily seen in FIG. 2, a bubble of the size of bubble 11 may seriously influence the clamping strength, at least locally, and may have a negative influence on the stability of the clamp.

Another mechanism that may lead to clamp instability is spontaneous void formation, for example caused by cavitation of or dissolved gas precipitation in the capillary liquid layer. An example of such a void has been denoted by reference numeral 13 in FIG. 2. Voids formed by cavitation may grow in a similar way as discussed before with respect to pre-existing bubbles if the clamp is brought into a vacuum environment. The resulting voids may have a negative influence on the clamp stability.

Besides decrease of the clamp stability due to the presence of bubbles and/or voids, the clamp stability will also be negatively affected by evaporation of liquid at the capillary layer interface, i.e. evaporation at the concave liquid surface. FIG. 2 schematically shows the effect of such evaporation. Due to evaporation, the position of the outer liquid surface 8 has shifted towards a new position to form outer liquid surface 8'. As a result of that shift, the surface area covered by the capillary layer, and thus the stability of the clamp, has decreased.

Figure 3A:
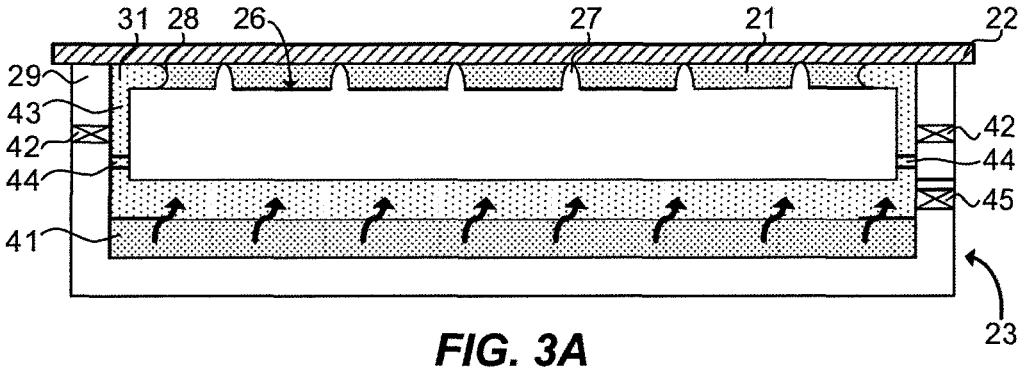
FIG. 3A is a sectional view of a substrate support structure according to a first embodiment of the invention.
Figure 3B:
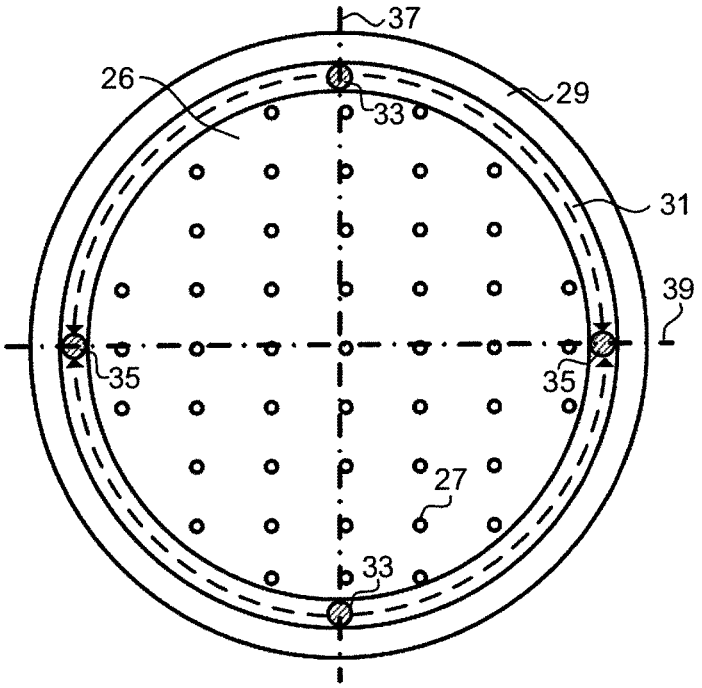
FIG. 3B is a top view of the substrate support structure of FIG. 3A.

FIGS. 3A and 3B are a sectional view and a top view of a substrate support structure 23 supporting a substrate according to a first embodiment of the invention respectively. The support structure is equipped to clamp a substrate 22 by means of a capillary layer 21. The surface 26 of the substrate support structure 23 is provided with a plurality of contact elements 27 in the form of burls. The substrate support structure 23 further comprises a sealing structure 29 and a liquid removal system.

In addition to or instead of using burls as contact elements 27, a plurality of spacers, e.g. glass grains, $SiO_2$ grains or the like may be dispersed uniformly over the surface 26 of the substrate support structure 23. The presence of contact elements like burls may reduce the influence of contamination by particles on the backside of the substrate 22. Furthermore, the contact elements serve the purpose of keeping the substrate 22 substantially flat by withstanding the clamping force of the capillary layer to prevent the occurrence of substrate bow.

The maximum pitch of contact elements 27 is determined by the requirements set for the maximum deflection of the substrate between adjacent contact elements caused by the clamping force of the capillary layer. The contact surface per contact element is such that it is sufficient to withstand deformation and/or destruction under the applied clamping pressure. Preferably, edges of a contact element are rounded to reduce the possibility of particle contamination, e.g. during cleaning operations. A typical value for the diameter of a burl 27 with a circular contact area would be in the range of 10-500 microns. A typical value for the pitch of a plurality of burls 27 would be in the range of 1-5 mm.

The nominal height of the contact elements determines the distance between the substrate 22 and the surface 26 of the substrate support structure 23, and thus the clamping pressure. Other parameters that may be varied to obtain a desired clamping pressure include material properties of the substrate 22, material properties of the surface 26 of the substrate support structure 23, surface area of the surface 26, contact element shape, contact element pitch, and the type of liquid used to form a capillary layer 21.

The sealing structure 29 circumscribes the surface 26 of the substrate support structure 23 facing the substrate 22 to be clamped. The sealing structure 29 may limit leakage of liquid evaporating from the capillary layer 21, when present. Preferably, the top side of the sealing structure 29 has a level corresponding in height with the nominal height of the plurality of burls 27. Such an arrangement increases the efficiency of vapor leakage prevention, which is in particular an issue in a vacuum environment.

The sealing structure 29 may comprise one or more elastically deformable elements like O-rings, e.g. made of viton or rubber. Such O-rings may be inserted in a part of the substrate support structure 23 with reduced height such that the top side of the O-ring is set to the level mentioned above. The O-ring may be provided with an incision at a radial side, e.g. the radial side facing the center of the substrate support structure 23, such that the O-ring can be compressed between substrate support structure 23 and substrate 22 without undue force requirement, but sufficient to prevent leakage of vapor.

Alternatively, as in FIG. 3A, the sealing structure 29 may comprise a vapor limiting ring, supported by an outer rim of the substrate support structure 23. The vapor limiting ring closes off the circumferential opening facing the capillary liquid surface, only leaving a very small vertical distance between the ring and the substrate 22 supported by the plurality of burls 27 on the surface 26 of the substrate support structure 23.

The liquid removal system is configured to remove liquid underneath the substrate to enable formation of a capillary layer 21. Further details regarding the formation of a capillary layer 21 by using a liquid removal system will be discussed with reference to FIG. 7.

The liquid removal system is configured to remove excess water from the surface 26 of the substrate support structure 23. In FIG. 3A, the liquid removal system comprises a gas distribution system, an embodiment of which is partly shown in FIG. 3B. The gas distribution system may comprise a moat 31 in circumference of the surface 26, one or more gas inlets 33 for allowing gas into the moat 31 and one or more gas outlets 35 for removing gas from the moat 31 respectively. If a sealing structure 29 is present, a gas flow may be established between the surface 26 provided with a liquid layer and the sealing structure 29, thus forming a channel flow as shown in FIG. 3B by the dashed arrows.

The one or more gas inlets 33 and the one or more gas outlets 35 may be provided along the moat 31 in a symmetrical fashion. In the embodiment of FIG. 3B, there are two gas inlets 33 and two gas outlets 35. The gas inlets 33 and gas outlets 35 are positioned in such a way that a first virtual line 37 formed by connecting the two gas inlets 33, and a second virtual line 39 formed by connecting the two gas outlets 35 are substantially perpendicular with respect to each other.

The substrate support structure 23 shown in FIG. 3A further comprises a liquid reservoir 41. The liquid reservoir 41 is configured to accommodate a certain volume of liquid, for example water, and further to store vapor of that liquid. Furthermore, the liquid reservoir is arranged to provide vapor to the capillary layer 21 when present, for example via one or more channels 43. The reservoir may be referred to as liquid reservoir 41. Preferably, the liquid in the liquid reservoir 41, reservoir liquid, is the same as the liquid within the capillary layer 21, i.e. capillary liquid. A suitable liquid for both reservoir liquid and capillary liquid would be water.

The presence of a liquid reservoir provides a way to further decrease evaporation of liquid from the capillary layer 21 when present. The free surface area of the liquid in the reservoir is preferably larger than the free surface area of the concave outer surface 28 of the capillary layer 21. The larger free surface area of the liquid stored in the reservoir ensures that a sufficient amount of vapor is available to moisturize the environment of surface 28, resulting in less vaporization within the capillary layer 21.

The vapor may be transported from the liquid reservoir 41 towards the outer liquid surface 28 of the capillary layer 21 by means of the one or more gas inlets 33 and/or the one or more gas outlets 35. In such a case, the gas for use in the gas distribution system may be provided to the substrate support structure via a valve 45 that is also used to provide liquid to the liquid reservoir 41.

Alternatively, gas may be provided via one or more separate gas connection units. If such gas connection units are configured to provide the gas flow via the one or more channels 43 used to provide vapor to the capillary layer, the one or more channels 43 may be provided with a flow control unit 44. Such a flow control unit 44 is configured to separate gas flow via the gas connection unit from vapor originating from the reservoir 41.

In yet another alternative embodiment, the gas distribution system is entirely separate from the one or more elements to provide the vapor from the vapor reservoir 41 to the clamp.

As mentioned earlier with reference to FIG. 2, the layer of capillary liquid evaporates in a vacuum environment. Experiments have shown that the remaining volume of the capillary liquid layer tends to accumulate at one side of the clamp. Due to this asymmetric distribution of the capillary layer, one side of the substrate "peels off" the table. Hereafter, the effect will be referred to as substrate peeling.

Figure 4:
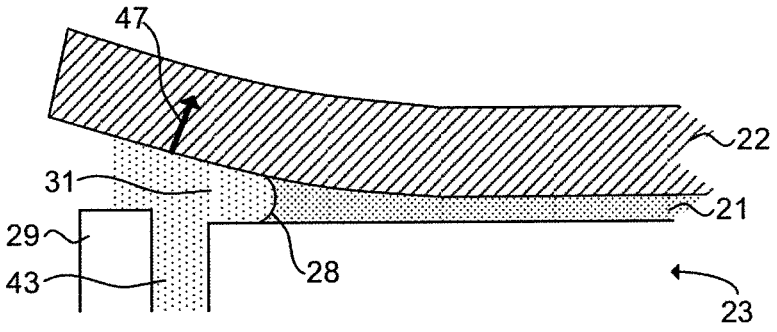
FIG. 4 schematically illustrates the concept of substrate peeling.

FIG. 4 schematically illustrates the concept of substrate peeling. Without wishing to be bound by theory, it is believed that due to unavoidable random instabilities the edge of the substrate 22 starts to lift away from the substrate support structure 23 at a location where the substrate 22 happens to be less strongly clamped. The movement of lifting is schematically represented in FIG. 4 by the arrow 47. Due to the peeling, vapor may more easily leak away from the capillary layer 21. Additionally, the outer liquid surface 28 of the capillary layer 21 increases, which leads to an increase in evaporation rate. Furthermore, the local peeling causes the capillary layer 21 to shift away from the area in which the peeling occurs. This leads to further unclamping. Thus, local peeling may limit the lifetime of the clamp significantly.

Figure 5:
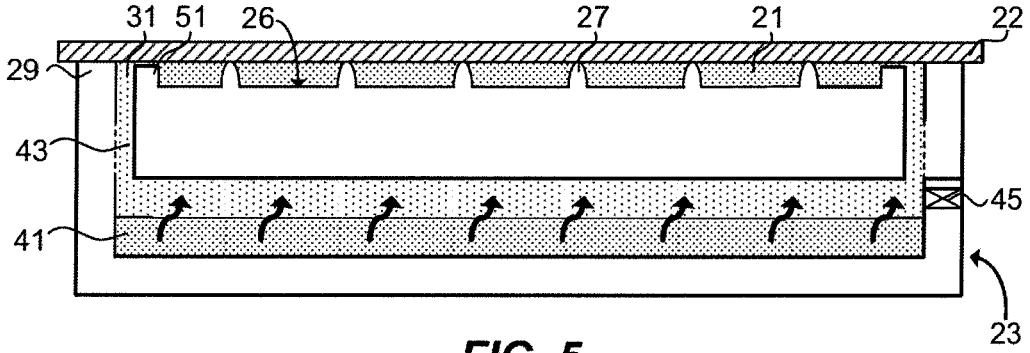
FIG. 5 is a sectional view of a substrate support structure supporting a substrate according to a second embodiment of the invention.

FIG. 5 is a sectional view of a substrate support structure 23 supporting a substrate 22 according to a second embodiment of the invention. The embodiment of the substrate support structure 23 of FIG. 5 further comprises a circumferential rim 51. The circumferential rim 51 provides a smaller distance between the substrate support structure 23 and the substrate 22. While the nominal distance between the substrate support structure 23 and the substrate 22, in FIGS. 1 and 2 referred to as height h, typically is about 3-10 microns, the distance between the circumferential rim 51 and the substrate 22 typically would lie in the range of 500 nm to 1.5 microns. Preferably, the circumferential rim 51 has a height being less than 1 micron smaller than the nominal height of contact elements provided on the surface 26 of the substrate support structure 23.

Figure 6A:
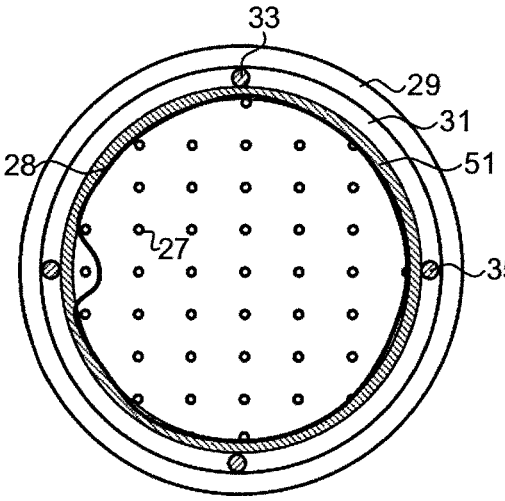
FIGS. 6A-6C are top views of the substrate support structure of FIG. 5 further schematically illustrating the concept of reclamping.
Figure 6B:
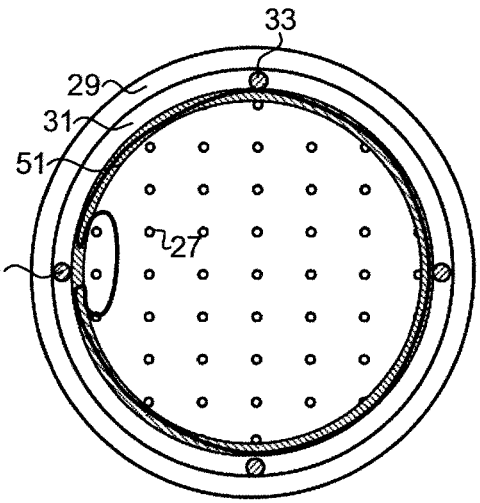
Figure 6C:
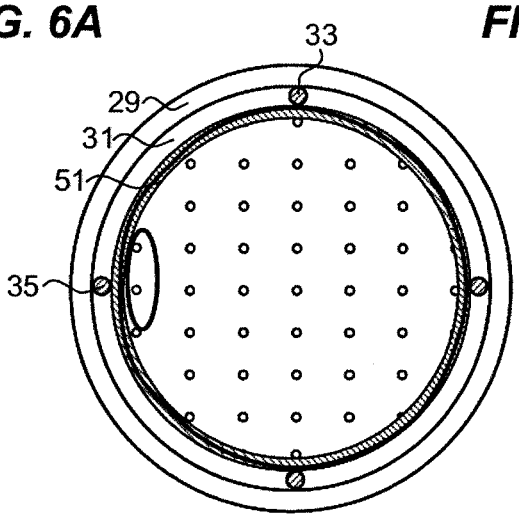

Without wishing to being bound by theory, the circumferential rim 51 is believed to limit substrate peeling in a way described with reference to FIGS. 6A-6C showing top views of the substrate support provided with a capillary layer. Although the presence of a circumferential rim 51 has been discussed with reference to FIG. 5, the use of such circumferential rim 51 is not limited to this embodiment. For example, a circumferential rim 51 may also be applied to the embodiment schematically depicted in FIG. 3A, and embodiments discussed in international patent application WO2009/011574.

First, as liquid evaporates from the outer capillary surface 28, it will recede into the small gap between the circumferential rim 51 and the substrate 22. Due to non-uniform evaporation, the outer capillary surface 28 may locally recede further inwards as schematically shown in FIG. 6A. The capillary pressure jump over the smaller gap between the circumferential rim 51 and the substrate 22 is much larger than the pressure jump would be in the main clamping area, e.g. about 1 bar versus about 200 mbar respectively. When the outer capillary surface 28 reaches the inner side surface of the circumferential rim 51 due to evaporation, the surface encounters the larger distance between substrate 22 and substrate support structure 23. The lower capillary pressure jump in this region causes a small amount of liquid to flow into the gap between the circumferential rim 51 and the substrate 22 as is schematically shown in FIG. 6B. The flow will continue until the gap between the circumferential rim 51 and the substrate 22 is completely filled as shown in FIG. 6C. A void will be left in the main clamping region. The void is entirely surrounded by a liquid layer. Effectively, the lost capillary clamping area due to evaporation has been moved inwardly. The outer capillary surface remains at the same position. As a result, the substrate edge will not peel off.

Embodiments of the substrate support structure 23 like the ones shown in FIGS. 3A and 5, may be designed in such a way that cavitation effects are minimized or non-existing. Without wishing to be bound by theory, it is understood that there is a critical radius for cavities. If the radius of a cavity becomes larger than this critical radius, the cavity may grow extensively. By using a substrate support structure that enables the formation of a capillary layer with a smallest dimension, i.e. a thickness h, that is very small, and preferably smaller than, the critical radius, cavitation will be largely limited or not occur. Experiments have shown that a capillary layer of water with a thickness h in the order of 3-10 microns does not experience cavitation.

As a specific measure, one or both of the contacting surfaces of the substrate 22 and the substrate support structure 23 may be surface treated, or coated with a material for influencing a contacting angle between the liquid forming the capillary layer 21 and the relevant contacting surface.

FIGS. 7A-7J schematically show execution of an embodiment of a method of clamping a substrate on a surface of a substrate support structure according to an embodiment of the invention. The method may be executed in a clamp preparation unit, which allows automation of a method of clamping a substrate on a substrate support structure.

The clamp preparation unit comprises a vacuum system that is able to provide a controlled pressure environment. Furthermore, the clamp preparation unit comprises a liquid dispensing unit for applying liquid, one or more gas connection units for providing and removing gas, and one or more liquid connection units for providing and removing liquid.

Figure 7A:
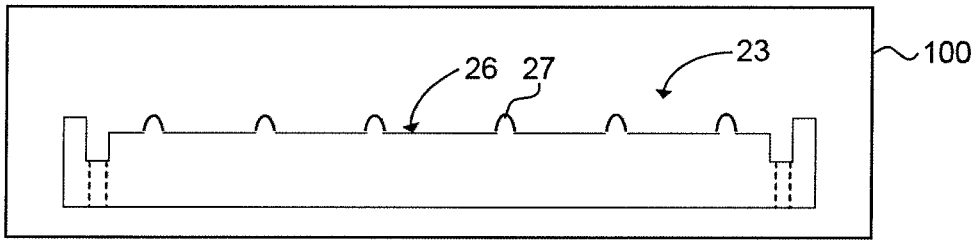
FIGS. 7A-7J schematically show execution of a method of clamping a substrate on a surface of a substrate support according to an embodiment of the invention.
Figure 7B:
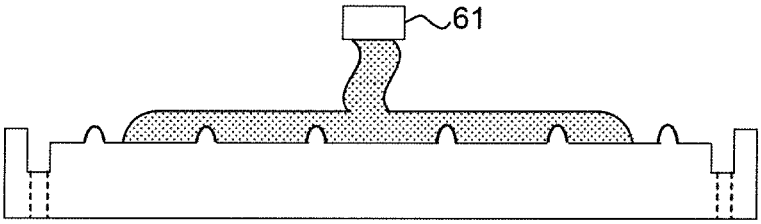

As shown in FIG. 7A, first, a substrate support structure 23 is placed in a vacuum chamber 100, for example a housing within the vacuum system of a clamp preparation unit. After placement of a substrate support structure 23 in a vacuum chamber 100, a liquid is applied on a surface 26 thereof, schematically shown in FIG. 7B. Application of liquid on surface 26 of the substrate support structure 23 may be performed by means of a liquid dispensing unit 61.

In FIGS. 7A-7J, the surface 26 of the substrate support structure 23 is provided with contact elements, e.g. burls 27. In one embodiment, applying the liquid continues at least until the contact elements are covered by a liquid layer 64. A typical thickness of the liquid layer 64 after the applying of liquid is in the range of 2-5 mm. Applying the liquid is preferably performed at a pressure level substantially equal to the vapor pressure of the liquid in the liquid layer 64. Applying the liquid at such pressure reduces the chance of dissolving of gases and/or entrainment of bubbles in the liquid.

Figure 7C:
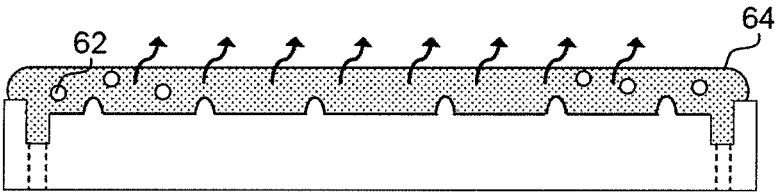

Optionally, after applying the liquid, a pausing action is performed. This action is schematically shown in FIG. 7C. The pausing allows diffusion of dissolved gases and/or entrained bubbles 62 out of the liquid layer 64. The removal of dissolved gases and/or entrained bubbles 62 reduces the chance of formation of voids as discussed with reference to FIG. 2.

Figure 7D:
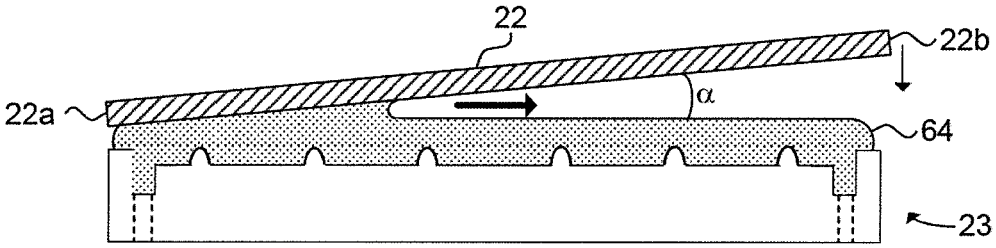

Then, a substrate 22 is placed on top of the liquid layer 64. Preferably, as schematically shown in FIG. 7D, the substrate is placed such that an edge at a first end portion 22a of the substrate 22 contacts the liquid layer 64 first at an initial angle, hereafter referred to as the tilt angle. After the first contact, the non-contacting end portion 22b of the substrate 22 is lowered until the substrate 22 fully rests on the liquid layer 64 as shown in FIG. 7E.

In FIG. 7D, the substrate 22 is placed at an initial angle $\alpha$. The liquid contacts the bottom surface of the substrate 22 and adheres to it due to capillary effects. In one embodiment, after first contact of one end portion 22a of the substrate 22, the other end portion 22b of the substrate 22 is lowered such that the water-substrate contact line moves along the bottom surface of the substrate 22 in the direction of the other end portion 22b, in FIG. 7D a movement to the right schematically illustrated by the arrow. Placement of the substrate 22 at a tilt angle reduces the chance of capturing air or gas between the substrate 22 and the substrate support structure 23, which improves the stability of the clamp to be established. The tilt angle alpha ($\alpha$) is an acute angle, preferably smaller than 10 degrees, and preferably greater than 5 degrees. Experiments have shown that such a tilt angle provides satisfactory results.

Figure 7E:
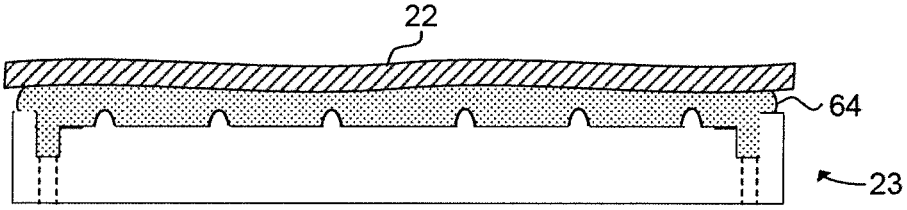

FIG. 7E shows the substrate 22 after placement onto the liquid layer 64. The substrate 22 floats on the liquid layer 64.

Figure 7F:
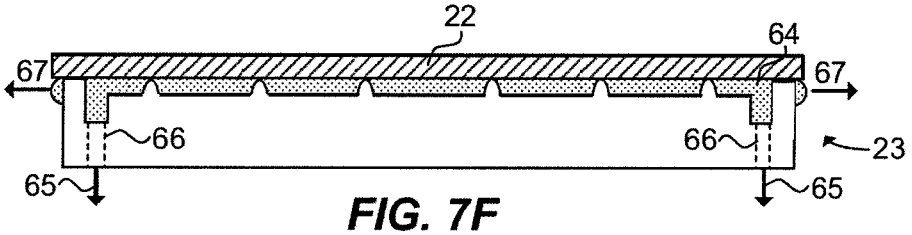

After placement of the substrate on top of the liquid layer, excess liquid is removed. The removal of excess liquid may comprise lowering a pressure underneath the substrate 22 to a pressure level substantially below the pressure level of the pressure surrounding the substrate support structure 23. This may be achieved by connecting the area underneath the substrate 22 with a low pressure environment, in FIG. 7F, schematically represented by arrows 65.

Due to the resulting difference between a pressure level above the liquid layer 64 and a pressure level below the liquid layer 64, the substrate 22 is pulled towards the substrate support structure 23. As a result, excess liquid is either sucked away via one or more channels 66, for example channels 33 and 35 of the gas distribution system depicted FIG. 3B, and/or squeezed out of the edge of the substrate support structure 23, schematically represented in FIG. 7F by arrows 67. After some time, the substrate 22 rests on the contact elements 27 of the substrate support structure surface 26.

The removal of excess liquid may further, or alternatively, comprise providing a gas flow along a circumference of the surface 26. The gas flow is provided at a pressure that is lower than the pressure above the substrate 22 so that the substrate 22 remains in contact with the contact elements. Suitable gases to be used in the gas flow include nitrogen, oxygen and helium.

The gas flow may remove excess liquid in one or more ways. For example, liquid may be swept away by the flow. Additionally, remaining droplets may evaporate in the gas flow. Evaporation of remaining droplets may be enhanced by providing dehumidified or "dry" gas, i.e. gas having a vapor content of less than 50%, preferably less than 10%, of its vapor saturation value.

Figure 7G:
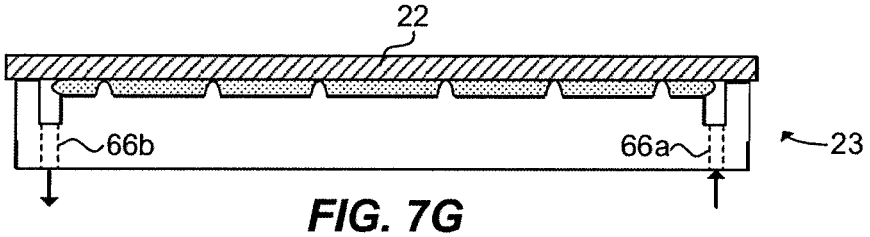
Figure 7H:
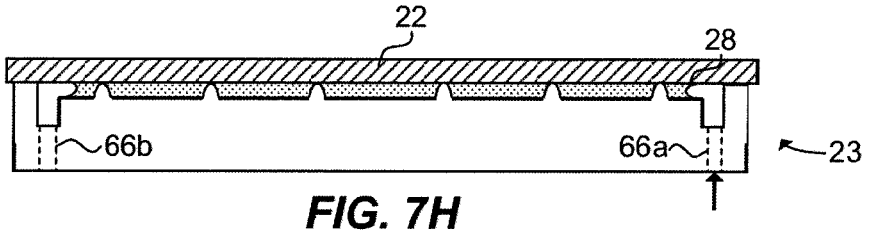
Figure 7I:
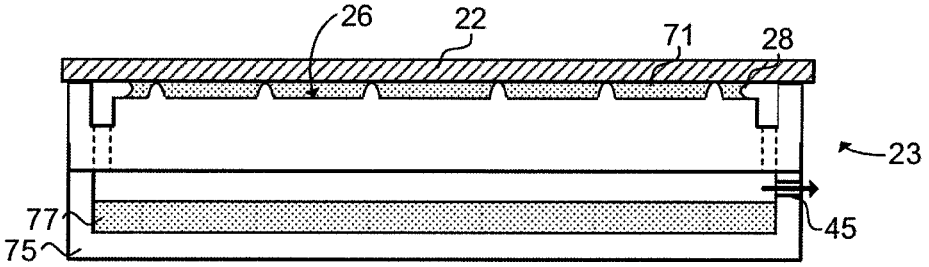

The providing of a gas flow is schematically shown in FIGS. 7G and 7H. Gas is allowed to enter the substrate support structure 23 via channel 66a, while gas is allowed to exit via channel 66b Channel 66a and channel 66b may correspond to gas inlet 33 and gas inlet 35 in FIG. 3B respectively. The gas flow is preferably maintained until a capillary layer 71 is formed, i.e. a thin layer of liquid with a concave outer surface 28 having a pressure below the pressure of its surroundings. Such a capillary layer has been discussed with reference to FIGS. 1 and 2.

After formation of the capillary layer due to the removal of excess liquid, the ambient pressure may be lowered. In order to be sure that the substrate 22 remains clamped, excess gas, if present, may be removed underneath the substrate 22, for example via valve 45 as schematically shown in FIG. 71.

Figure 7J:
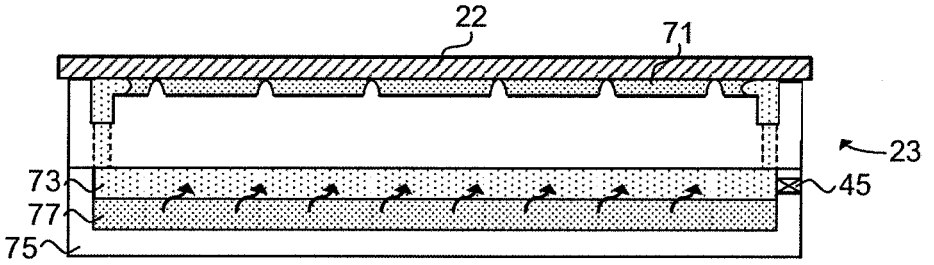

In embodiments of the invention, after formation of the capillary layer 71, vapor may be provided to the capillary layer. The vapor 73 may be provided by a reservoir 75 at least partly filled with reservoir liquid 77. The reservoir 75 may be part of the substrate support structure 23 as shown in FIGS. 71 and 7J. Alternatively, the reservoir 75 may be an external reservoir. The vapor 73 may then be provided via a transfer system connectable to both the external reservoir and the substrate support structure 23.

It must be noted that the liquid vapor reservoir 75 may be provided as a separate module that can be connected to the substrate support structure 23. The provided vapor limits evaporation of liquid from the capillary layer 71. This may lead to a longer lifetime of the clamp.

FIG. 8 schematically shows a top view of a substrate support structure 83 according to a third embodiment of the invention. The substrate support structure 83 comprises a surface 86 for clamping a substrate. Preferably, the surface is provided with contact elements 87. Additionally, the substrate support structure comprises a gas distribution system including a moat 91, gas inlets 93, and gas outlets 95. Functions of these components have been discussed with reference to FIG. 3A and equally apply for this embodiment. The substrate support structure 83 may be used in embodiments of the method of clamping in a similar way as discussed with respect to substrate support structure 23 with reference to FIGS. 7A-7J.

In contrast to embodiments of the substrate support structure 23 shown in FIGS. 3A and 5, substrate support structure 83 comprises a surface 86 which is divided in a plurality of sub-surfaces. The sub-surfaces may take the form of tiles, for example of hexagonal shape, and be arranged in a tessellated pattern. Each tile may be provided with a circumferential rim (not shown), similar to the circumferential rim 51 discussed with reference to FIG. 5. The use of a surface 86 divided in a plurality of sub-surfaces may be beneficial if relatively large substrates need to be clamped, for example 300 mm wafers.

Figure 8A:
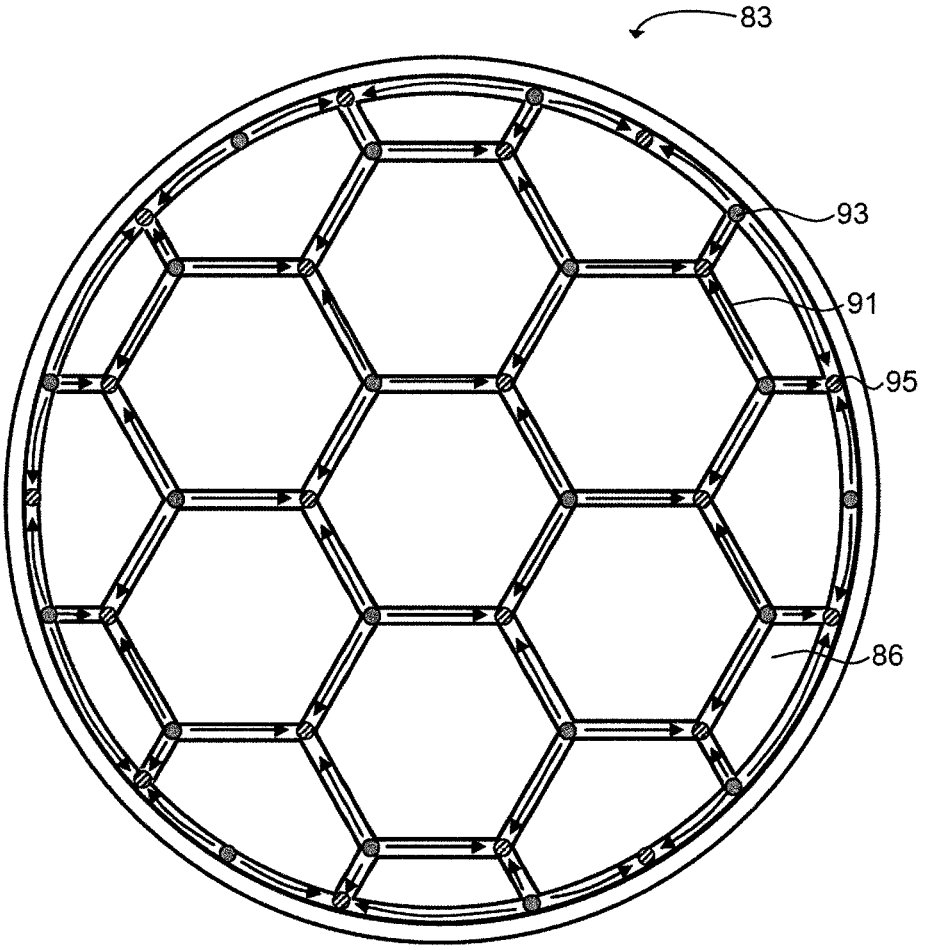
FIG. 8A schematically shows a top view of a substrate support structure according to a third embodiment of the invention.
Figure 8B:
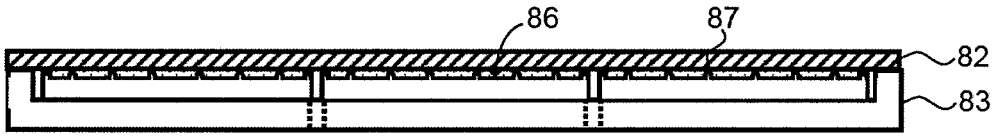
FIG. 8B schematically shows a sectional view of a clamp formed by a combination of the substrate support structure of FIG. 8A and a substrate.

FIG. 8B schematically shows a sectional view of a clamp formed by a combination of the substrate support structure 83 of FIG. 8A and a substrate 82 for illustrative purposes.

Figure 9:
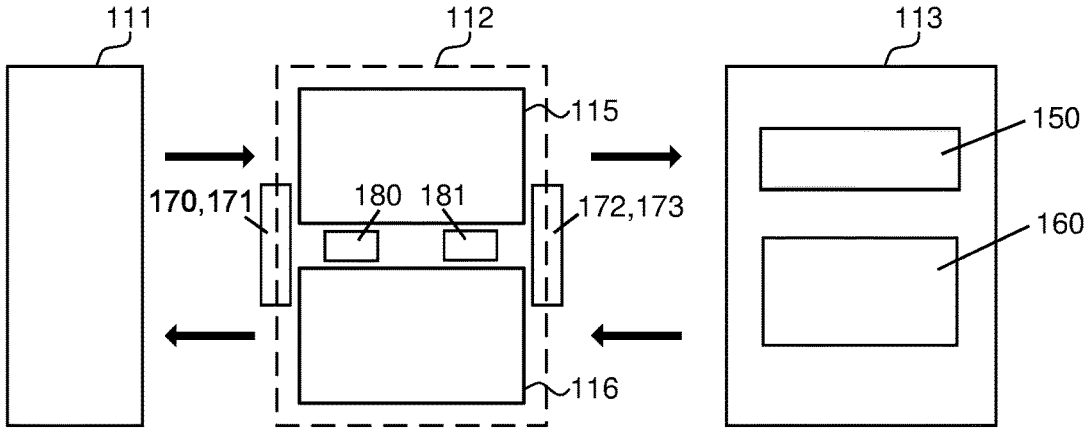
FIG. 9 schematically shows a substrate handling and exposure arrangement which may be used in conjunction with embodiments of the substrate support structure.
Figure 10:
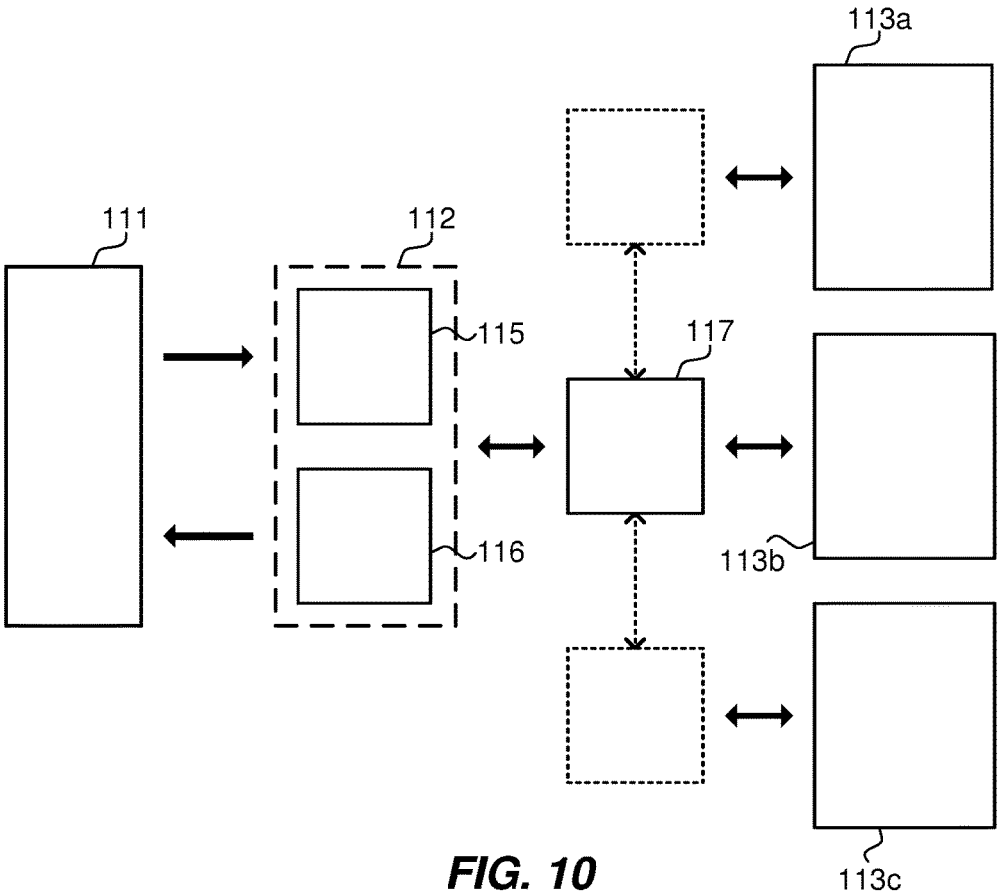
FIG. 10 schematically shows a different substrate handling and exposure arrangement that may be used in conjunction with embodiments of the substrate support structure.

FIGS. 9 and 10 schematically show different substrate handling and exposure arrangements which may be used in conjunction with embodiments of the substrate support structures discussed earlier. FIGS. 9 and 10 will be explained with reference to an example related to lithographic processing of wafers. It must be understood that the arrangements are not limited to such an application. FIG. 11 schematically shows an embodiment of a clamp preparation unit that may be used to automate embodiments of a method of clamping a substrate on a substrate support structure, for example embodiments explained with reference to FIGS. 7A-7J.

Now referring to FIG. 9, in the substrate handling and exposure arrangement, a clamp preparation unit 112 is used to automate a method of clamping a wafer on a wafer support structure. The clamp preparation unit 112 accepts a wafer to be clamped from a substrate distribution facility, in this example a so-called wafer track 111. In the clamp preparation unit 112, the clamp is prepared, e.g. by using the method outlined with respect to FIGS. 7A-7J. After preparation of the clamp, the clamp is forwarded to a substrate processing unit, in this example a lithographic apparatus 113. The lithographic apparatus may comprise a radiation system 150 to provide a patterned beam of radiation, a substrate support structure to support a substrate, and an optical system 160 to project the patterned beam of radiation onto a target portion of the substrate as will be understood by a person skilled in the art. Further details regarding operation of an exemplary clamp preparation unit will be explained with reference to FIGS. 11A-11D.

In FIG. 9, the clamping procedure is schematically denoted by reference number 115. Further details regarding operation of an exemplary clamp preparation unit will be explained with reference to FIGS. 11A-11D. The clamp preparation unit 112 comprises a vacuum system for providing a controlled pressure environment. The clamping procedure may start with the introduction of a wafer 122 into the vacuum system of the clamp preparation unit 112, for example by means of a robot arm 180 provided with a wafer support 121 as shown in FIG. 11A.

The wafer 122 may be introduced via a vacuum tight door 170 or a load lock chamber 171. The wafer support structure 123 may already be present in the clamp preparation unit 112. Alternatively, the wafer support structure 123 may be introduced in a similar way as the wafer 122.

Figure 11A:
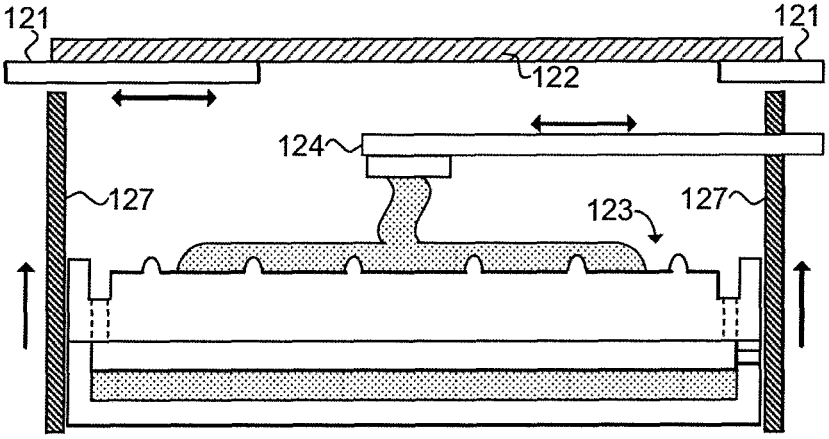
FIGS. 11A-11D schematically show operation of an exemplary clamp preparation unit to be used in the substrate handling and exposure arrangement of FIG. 9 or FIG. 10.

Then, liquid may be applied onto the surface of the wafer support structure 123 by means of the liquid dispensing unit 124 as shown in FIG. 11A. The liquid dispensing unit 124 provides a liquid flow until a liquid layer of sufficient "thickness" is provided, and then shuts off the liquid flow. Preferably, the liquid dispensing unit 124 is moveable within the clamp preparation unit 112 such that applying of liquid is performed in an efficient manner without disturbing earlier and subsequent actions in the clamping procedure. Preferably, the pressure in the clamp preparation unit 112 during applying the liquid onto the surface of the wafer support structure 123 is below ambient pressure, for example substantially equal to the vapor pressure of the liquid in the liquid layer. Alternatively, the pressure in the clamp preparation unit may be reduced after applying the liquid but before clamping the wafer.

Figure 11B:
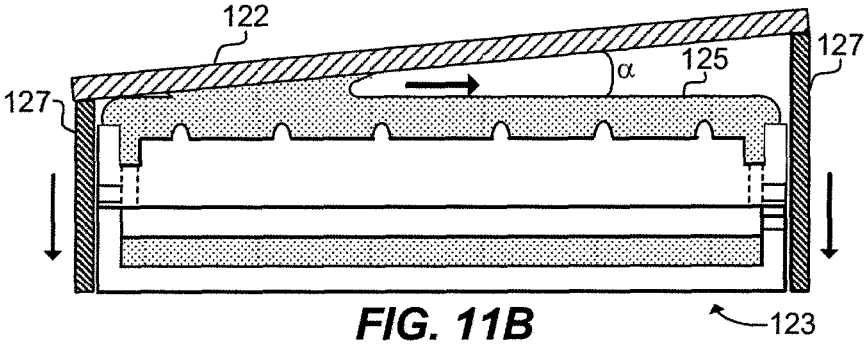

The wafer 122 and wafer support structure 123 are then moved with respect to each other to allow placement of the wafer on the liquid layer 125. For this purpose, the wafer 122 is lowered onto the liquid layer 125 by means of a substrate transfer unit, for example moveable support pins 127 as shown in FIG. 11B. As discussed earlier with reference to FIG. 7D, the first contact between the wafer 122 and the liquid layer 125 may be made at an initial tilt angle alpha ($\alpha$), preferably less than 10 degrees and preferably greater than 5 degrees. Such tilted placement may be achieved by lowering one side of the wafer 122 before lowering the other side of the wafer 122, for example by separate controlled movement of the support pins 127. Each side of the wafer 122 is lowered until contact is made with the liquid layer 125, and the support pins 127 may then be lowered further and moved out of the way. Placement of the wafer 122 on the liquid layer 125 may be performed at ambient pressure, i.e. about 1 bar. However, placement at low pressure is preferred, for example a pressure substantially equal to the vapor pressure of the liquid in the liquid layer.

Figure 11C:
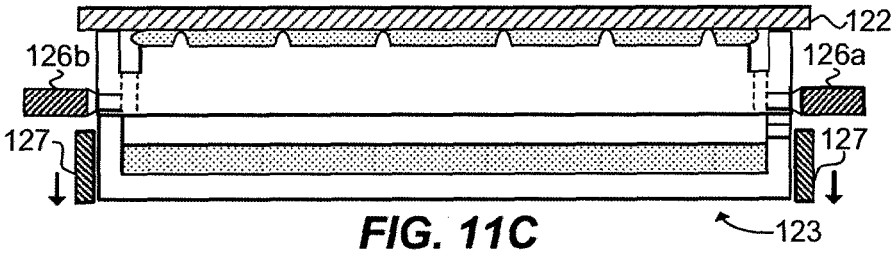

The wafer support structure 123 may now be connected to one or more liquid connection units connectable to the wafer support structure 123 for removing liquid away from the wafer support structure. In an embodiment, connectors 126a, 126b as shown in FIG. 11C may be used for this purpose. Alternatively, connecting of these one or more liquid connection units has been established earlier. Excess liquid is removed via the one or more liquid connection units. Removal of liquid may be performed at ambient pressure, i.e. about 1 bar.

Furthermore, the wafer support structure 123 may comprise one or more gas connection units for connecting the wafer support structure 123 with a gas supply, for example connectors 126a, 126b in FIG. 11C. The gas connection units may establish an low pressure by "connection" to a vacuum. Additionally and/or alternatively, the gas connection units may provide a gas flow for enabling formation of a capillary layer between the wafer 122 and the wafer support structure 123 as discussed earlier with reference to FIGS. 7A-7J. Providing a gas flow may be performed at ambient pressure, i.e. about 1 bar. Note that the pressure provided by the gas flow needs to be lower than the ambient pressure to ensure that the wafer 122 keeps its position with respect to the wafer support structure 123.

Figure 11D:
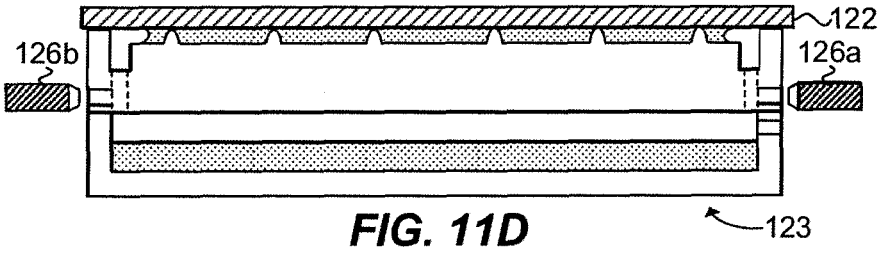

Before forwarding the clamp to the lithographic apparatus 113, as schematically shown in FIG. 11D, the connections 126a, 126b are removed. Forwarding the clamp may be performed by means of a robot arm 181 via a vacuum tight door 172 or a load lock chamber 173.

After processing in the lithographic apparatus 113, the clamp may be transferred back to the clamp preparation unit 112 or to a separate unclamping unit for unclamping, i.e. removing the wafer from the wafer support structure. In FIG. 9, the process of unclamping is schematically denoted by reference number 116. Unclamping may be performed by introducing the clamp into the clamp preparation unit 112, connecting the one or more liquid connectors to the wafer support structure 123. Via the one or more liquid connectors, additional liquid may be provided to the capillary liquid layer to increase the thickness of the liquid layer. Additional liquid may be added so that the wafer 122 starts to float on top of a liquid layer. The introduction of additional liquid may be applied in such a way that liquid pressure is substantially homogeneously distributed so that the wafer 122 will not deform or break.

At that stage, the wafer 122 may be lifted from the liquid layer on the wafer substrate support surface 123, e.g. by means of support pins 127. The wafer may be lifted at an initial tilt angle, in the reverse of the process described above of placing the wafer onto the liquid layer. The initial tilt angle during lifting of the wafer is preferably less than 10 degrees and preferably greater than 5 degrees, which may be achieved by lifting one side of the wafer before lifting the other side, for example by separate controlled movement of the support pins. Finally, the wafer 122 may be extracted from the clamp preparation unit 112, for example by using a robot arm provided with wafer support 121, and transferred towards the wafer track 111.

In FIG. 9, the clamp preparation unit 112 and the lithographic apparatus 113 are depicted as separate units. However, it must be understood that it is also possible to integrate the clamp preparation unit 112 into a lithographic apparatus 113, for example by including the required functionality of the clamp preparation unit 112 in a load lock of the lithographic apparatus 113. In such a case, wafers will be clamped and unclamped as they enter and exit the lithographic apparatus respectively.

FIG. 10 schematically shows a different substrate handling and exposure arrangement that may be used in conjunction with embodiments of the substrate support structure. In the arrangement of FIG. 10, instead of a single lithographic apparatus 113 more lithographic apparatus 113a, 113b, 113c are used. The functionality of the wafer track 111 and the clamp preparation unit 112 is the same as described with reference to FIG. 9.

In FIG. 10, a clamp ready to be transferred to a lithographic apparatus for processing may be transferred towards three different lithographic apparatus 113a, 113b, 113c via an additional wafer track 117. The configuration of FIG. 10 may be more efficient if the typical duration of the clamping method to be performed within the clamp preparation unit 112 is faster than the typical duration of a lithographic process to be performed in any one of the lithographic apparatus 113a, 113b, 113c.

Throughout the description, reference has been made to the expression "capillary layer". The expression "capillary layer" should be understood to refer to a thin layer of liquid with a concave meniscus shape having a pressure below the pressure of its surrounding.

Additional aspects of the present invention are further defined in a substrate support structure for clamping a substrate on a surface thereof, where the substrate support structure comprises a surface for receiving a substrate to be clamped by means of a capillary layer of a liquid, a liquid reservoir for storing reservoir liquid and vapor of the reservoir liquid, and a vapor transfer system connecting the reservoir with the receiving surface such that vapor of the reservoir liquid can be provided to the capillary layer when present. The reservoir may extend underneath the receiving surface. Preferably, the reservoir comprises a cavity having a greater portion located underneath the receiving surface and a lesser portion extending out from a circumference of the receiving surface. The volume for storage of the reservoir liquid in the reservoir may be greater than a volume of the capillary layer of liquid. The reservoir may be detachable from the receiving surface. In use, the capillary layer may have a concavely shaped outer surface, and a free surface area of the liquid in the reservoir is larger than a free surface area of said concavely shaped outer surface. The substrate support structure may further comprise a liquid removal system for removing liquid circumferential to said surface. The liquid removal system may comprise a gas distribution system. The gas distribution system may comprise at least one gas inlet for providing gas, and at least one gas outlet for removing gas. Alternatively, the gas distribution system may have a plurality of gas inlets and a plurality of gas outlets at equidistant positions with respect to each other. The substrate support structure may further comprise a gas connection unit for connecting the substrate support structure with a gas supply. The gas connection unit may be connected to the vapor transfer system. The vapor transfer system may comprise a flow control unit for separating gas flow via the gas connection unit from vapor originating from the reservoir. The flow control unit may be a valve or flap. The reservoir of the substrate support structure may be located in a removable portion of the substrate support structure. The reservoir and the vapor transfer system may be located in a removable portion of the substrate support structure. The substrate support structure may further comprise a sealing structure circumscribing the receiving surface such that gas provided by the gas distribution system can flow between the receiving surface and the sealing structure. The receiving surface may be provided with a plurality of contact elements, and wherein the sealing structure has a height corresponding to the height of the plurality of contact elements. Alternatively, the receiving surface may further comprise a raised circumferential rim, such that gas provided by the gas distribution system can flow between the circumferential rim and the sealing structure. In such embodiment, the receiving surface may be provided with a plurality of contact elements, and wherein the circumferential rim has a height smaller than the height of the plurality of contact elements. The receiving surface may be divided into a plurality of sub-surfaces. The liquid removal system may then be configured to remove liquid circumferential to each sub-surface. In case of a plurality of sub-surfaces, at least one sub-surface may have a substantially hexagonal shape.

An additional aspect of the present invention is further defined in a method for maintaining a substrate clamped to a substrate support structure, where the method comprises providing a substrate support structure having a surface on which a substrate has been clamped by means of a capillary layer, providing a reservoir storing reservoir liquid and vapor of the reservoir liquid, and enabling transfer of the vapor of the reservoir liquid from the reservoir to the capillary layer to limit evaporation from the capillary layer. The substrate support structure may be any substrate support structure described earlier.

The invention has been described by reference to certain embodiments discussed above. It will be recognized that these embodiments are susceptible to various modifications and alternative forms well known to those of skill in the art without departing from the spirit and scope of the invention. Accordingly, although specific embodiments have been described, these are examples only and are not limiting upon the scope of the invention, which is defined in the accompanying claims.

What is claimed is:

1. A substrate handling and exposure arrangement comprising:

a plurality of lithographic apparatus, wherein each lithographic apparatus [comprises a radiation system to provide a patterned beam of radiation and an optical system] *is configured* to project [the] *a* patterned beam of radiation onto a target portion of a wafer;

a wafer support structure;

a clamp preparation unit for clamping the wafer onto said wafer support structure to form a clamp, the clamp comprising the wafer clamped to the wafer support structure;

a wafer track, wherein the clamp preparation unit is configured for accepting the wafer from the wafer track; and an additional wafer track for transferring the clamp from the clamp preparation unit towards the plurality of lithographic apparatus for the clamp to be processed in one of the plurality of lithographic apparatus, and for transferring the clamp back to the clamp preparation unit or to a separate unclamping unit.

2. Arrangement according to claim 1, wherein the clamp preparation unit comprises a vacuum system for providing a controlled pressure environment.

3. Arrangement according to claim 2, further comprising a robot arm provided with a wafer support for introducing the wafer into the vacuum system of the clamp preparation unit.

4. Arrangement according to claim 2, comprising a vacuum tight door or a load lock chamber for introduction of the wafer into the clamp preparation unit.

5. Arrangement according to claim 1, comprising a second robot arm and a second vacuum tight door or a second load lock chamber for forwarding the clamp to one of the plurality of the lithographic apparatus.

6. Arrangement according to claim 1, wherein the clamp preparation unit is further configured for removing the wafer from the wafer support structure.

7. Arrangement according to claim 1, comprising a separate unclamping unit for removing the wafer from the wafer support structure.

8. Arrangement according to claim 1, wherein the clamp preparation unit comprises one or more gas connection units for providing and removing gas, and one or more liquid connection units for providing and removing liquid, and wherein the wafer support structure comprises one or more connectors for connecting to the one or more gas or liquid connection units.

9. Arrangement according to claim 1, wherein the clamp preparation unit comprises a liquid dispensing unit for applying liquid onto the surface of the wafer support structure, and wherein the wafer support structure comprises a substrate transfer unit for lowering the wafer onto a liquid layer formed on the surface of the wafer support structure, and for lifting the wafer from the liquid layer on the wafer support surface, wherein the substrate transfer unit comprises a plurality of separately controlled movable support pins.

10. Method of handling and processing substrates, comprising:

providing a wafer track *and an additional wafer track*;

providing a clamp preparation unit and a wafer support structure, the clamp preparation unit accepting a wafer to be clamped on said wafer support structure from said wafer track;

providing a plurality of lithographic apparatus, each lithographic apparatus [comprising a radiation system to provide a patterned beam of radiation and an optical system] *configured* to project [the] *a* patterned beam of radiation onto a target portion of the wafer;

preparing the clamp in the clamp preparation unit, the clamp comprising the wafer clamped to the wafer support structure;

forwarding the clamped wafer *from the clamp preparation unit* to one of said plurality of lithographic apparatus *using the additional wafer track*;

processing the wafer in the lithographic apparatus;

transferring the clamp back to the clamp preparation unit or to a separate unclamping unit *using the additional wafer track*;

unclamping the wafer;

extracting the wafer from the clamp preparation unit or from said separate unclamping unit; and transferring the wafer towards the wafer track.

11. Method according to claim 10, wherein the wafer is introduced into a vacuum system of the clamp preparation unit by means of a robot arm provided with a wafer support.

12. Method according to claim 10, wherein the wafer is introduced into a vacuum system of the clamp preparation unit via a vacuum tight door or a load lock chamber.

13. Method according to claim 10, wherein the wafer support structure is already present in the clamp preparation unit.

14. Method according to claim 10, wherein the wafer support structure is introduced into the clamp preparation unit in a similar way as the wafer.

15. Method according to claim 10, further comprising:

applying liquid onto the surface of the wafer support structure by means of a liquid dispensing unit;

moving the wafer and the wafer support structure with respect to each other; and subsequently lowering the wafer onto the liquid layer by means of a substrate transfer unit, said substrate transfer unit comprising a plurality of separately controlled movable support pins.

16. Method according to claim 10, further comprising extracting the wafer from the clamp preparation unit by using a robot arm provided with a wafer support, and transferring the wafer back toward the wafer track.

17. Method according to claim 10, wherein the duration of the clamping method performed in the clamp preparation unit is shorter than the duration of a lithographic process to be performed in one of the lithographic apparatus.

*18. A method of unclamping a substrate from a substrate support structure, where the substrate is clamped by means of a capillary clamping force exerted by a capillary layer of liquid between the substrate and a surface of the substrate support structure, the method comprising:*

*providing additional liquid to the capillary layer; and lifting the substrate from the liquid.*

* * * * *